United States Patent
Lan et al.

(10) Patent No.: US 9,659,884 B2
(45) Date of Patent: May 23, 2017

(54) CARRIER SUBSTRATE

(71) Applicant: Powertech Technology Inc., Hsinchu County (TW)

(72) Inventors: Yuan-Fu Lan, Hsinchu County (TW); Hsien-Wen Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/298,234

(22) Filed: Oct. 20, 2016

(65) Prior Publication Data
US 2017/0047295 A1 Feb. 16, 2017

Related U.S. Application Data

(63) Continuation-in-part of application No. 15/096,293, filed on Apr. 12, 2016, now abandoned.

(51) Int. Cl.
| | |
|---|---|
| *H05K 1/09* | (2006.01) |
| *H01L 23/00* | (2006.01) |
| *H01L 23/498* | (2006.01) |
| *H05K 1/18* | (2006.01) |

(52) U.S. Cl.
CPC ...... *H01L 23/562* (2013.01); *H01L 23/49838* (2013.01); *H01L 23/49866* (2013.01); *H01L 23/49894* (2013.01); *H05K 1/18* (2013.01); *H05K 2201/10204* (2013.01)

(58) Field of Classification Search
CPC .............. H05K 2201/10204; H01L 23/49838
USPC ....................................... 174/251
See application file for complete search history.

(56) References Cited

U.S. PATENT DOCUMENTS

| | | | |
|---|---|---|---|
| 2004/0084205 A1* | 5/2004 | Chang | H01L 23/49822 174/250 |
| 2008/0122100 A1 | 5/2008 | Tsao et al. | |
| 2013/0062760 A1 | 3/2013 | Hung et al. | |
| 2013/0126215 A1* | 5/2013 | Cho | H05K 1/0206 174/252 |

FOREIGN PATENT DOCUMENTS

| | | |
|---|---|---|
| TW | 1313902 | 8/2009 |
| TW | 201142932 | 12/2011 |
| TW | 201316420 | 4/2013 |
| TW | 201526200 | 7/2015 |

* cited by examiner

*Primary Examiner* — Sherman Ng
(74) *Attorney, Agent, or Firm* — Jianq Chyun IP Office

(57) ABSTRACT

A carrier substrate includes an insulation encapsulation, first conductive patterns, second conductive patterns, at least one first dummy pattern, and at least one second dummy pattern. The carrier substrate has a first layout region and a second layout region. The first conductive patterns and the first dummy pattern are located in the first layout region. The second conductive patterns and the second dummy pattern are located in the second layout region. The first and second conductive patterns and the first and second dummy patterns are embedded in the insulation encapsulation. The insulation encapsulation exposes top surfaces of the first and second conductive patterns and the first and second dummy patterns. The first dummy pattern and the second dummy pattern are insulated from the first conductive patterns and the second conductive patterns. An edge profile of the first dummy pattern facing the second dummy pattern is non-linear.

17 Claims, 5 Drawing Sheets

CARRIER SUBSTRATE

CROSS-REFERENCE TO RELATED APPLICATION

This application is a continuation-in-part application of and claims the priority benefit of a prior application Ser. No. 15/096,293, filed on Apr. 12, 2016. The prior application Ser. No. 15/096,293 claims the priority benefit of Taiwan application serial no. 104126612, filed on Aug. 14, 2015. The entirety of each of the above-mentioned patent applications is hereby incorporated by reference herein and made a part of this specification.

BACKGROUND OF THE INVENTION

1. Field of the Invention

The disclosure relates to a carrier substrate, and particularly relates to a carrier substrate having dummy patterns with non-linear edge profile.

2. Description of Related Art

In recent years, with the rapid progress of electronic technologies and the prosperous development of high-tech electronic industries, more user-friendly electronic products with better functions continuously emerge and evolve toward a light, thin, short and small trend. The electronic products usually include a plurality of semiconductor package structures. In general, the semiconductor package structures may be formed by stacking a plurality of dies on a carrier substrate. Therefore, development of the carrier substrate in the semiconductor package structures plays an important role in enhancing the performance of the electronic products.

SUMMARY OF THE INVENTION

The disclosure provides a carrier substrate which is able to alleviate the problem of breakage during assembly process, thereby improving the reliability of the semiconductor package and the electronic products using the carrier substrate.

The disclosure provides a carrier substrate including an insulation encapsulation, a plurality of first conductive patterns, a plurality of second conductive patterns, at least one first dummy pattern, and at least one second dummy pattern. The carrier substrate has a first layout region and a second layout region. The first conductive patterns is located in the first layout region and the second conductive patterns is located in the second layout region. The first conductive patterns and the second conductive patterns are embedded in the insulation encapsulation. The insulation encapsulation exposes top surfaces of the first conductive patterns and the second conductive patterns. The first dummy pattern is located in the first layout region and the second dummy patterns located in the second layout region. The first dummy pattern and the second dummy pattern are insulated from the first conductive patterns and the second conductive patterns. The first dummy pattern and the second dummy pattern are embedded in the insulation encapsulation. The insulation encapsulation exposes top surfaces of the first dummy pattern and the second dummy pattern. An edge profile of the first dummy pattern facing the second dummy pattern is non-linear.

Base on the above, by altering the edge profile of the dummy patterns in a carrier substrate, the breakage among the dummy pattern, the conductive pattern, and the insulation encapsulation may be sufficiently eliminated, thereby improving the reliability of a semiconductor package and an electronic product using the carrier substrate. In addition, by increasing the thickness of certain portion of the dummy patterns, the contact area between the dummy patterns and the insulation encapsulation may be enlarged. Therefore, the scenario where breakage occurs may be reduced and the reliability of the semiconductor package and the electronic products may be further ensured.

In order to make the aforementioned features and advantages of the disclosure more comprehensible, embodiments accompanying figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
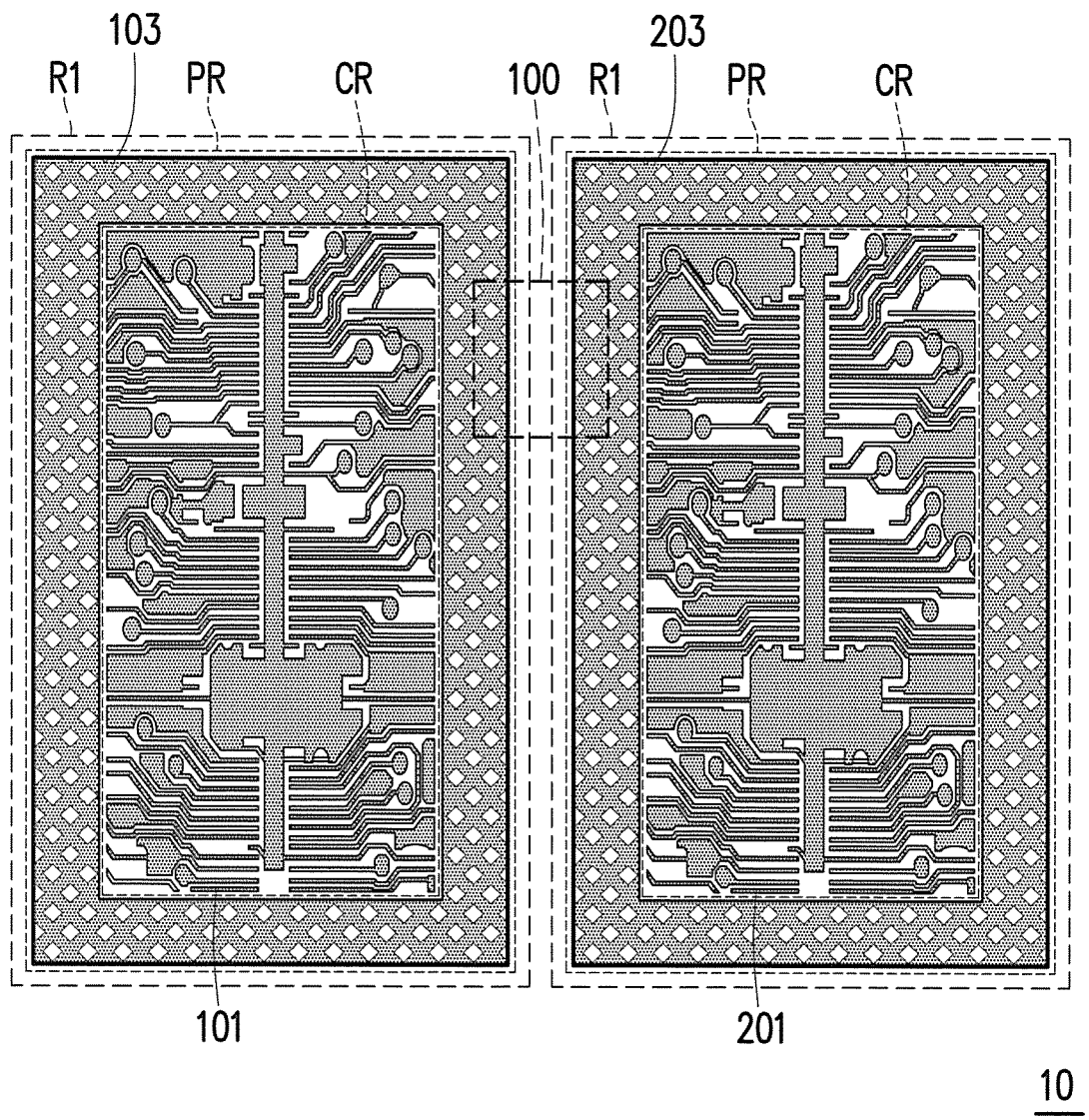
FIG. 1 is a schematic top view illustrating a carrier substrate according to some embodiments of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

FIG. 1 is a schematic top view illustrating a carrier substrate 10 according to some embodiments of the disclosure. Referring to FIG. 1, the carrier substrate 10 includes a first layout region R1 and a second layout region R2 adjacent to the first layout region R1. The first layout region R1 and the second layout region R2 respectively includes a core region CR and a peripheral region PR. As illustrated in FIG. 1, in some embodiments, the peripheral region PR surrounds the core region CR. The core region CR of the first layout region R1 includes a plurality of first conductive patterns 101 and the core region CR of the second layout region R2 includes a plurality of second conductive patterns 201. In some embodiments, the peripheral region PR of the first layout region R1 includes a first dummy pattern 103 and the peripheral region PR of the second layout region R2 includes a second dummy pattern 203. In some embodiments, since the peripheral region PR surrounds the core region CR, the first dummy pattern 103 surrounds the first conductive patterns 101 and the second dummy pattern 203 surrounds the second conductive patterns 201.

The first conductive patterns 101 and the second conductive patterns 201 are used for signal transmission. For example, the first conductive patterns 101 and the second conductive patterns 201 may be metallic traces made of copper, aluminium, gold, silver, nickel, palladium, or a combination thereof. Some of the first conductive patterns 101 may be interconnected with each other. Similarly, some of the second conductive patterns 201 may be interconnected with each other. Since the first conductive patterns 101 and the second conductive patterns 201 located in the core region CR are used for signal transmission, the core region CR may be referred to as an active region.

The first dummy pattern 103 and the second dummy pattern 203 are electrically insulated from the first conductive patterns 101 and the second conductive patterns 201. Unlike the first conductive patterns 101 and the second conductive patterns 201, the first dummy patterns 103 and the second dummy patterns 203 are not used for signal transmission. In some embodiments, the first dummy pattern 103 and the second dummy pattern 203 may be connected to a ground or may be connected to a power source (not illustrated). A ground bias or a power bias may be applied to the first dummy pattern 103 and the second dummy pattern 203. In other words, a constant voltage is applied to the first dummy pattern 103 and the second dummy pattern 203. However, the disclosure is not limited thereto. The first dummy patterns 103 and the second dummy pattern 203 may also serve other functions based on circuit design. For example, in some alternative embodiments, the first dummy pattern 103 and the second dummy pattern 203 may be electrically floating. In other words, no voltage is applied to the first dummy pattern 103 and the second dummy pattern 203. In some embodiments, the first dummy pattern 103 and the second dummy pattern 203 are mesh structures as illustrated in FIG. 1.

In some embodiments, the first conductive patterns 101, the second conductive patterns 201, the first dummy pattern 103, and the second dummy pattern 203 may be formed by a same process. For example, the first conductive patterns 101, the second conductive patterns 201, the first dummy pattern 103, and the second dummy pattern 203 may be formed on a stainless board (not illustrated) through a plating process, but the disclosure is not limited thereto. Other suitable methods may be adapted to form the first conductive patterns 101, the second conductive patterns 201, the first dummy pattern 103, and the second dummy pattern 203. The stainless board may be removed after the formation of the carrier substrate 10 is completed.

Figure 2A:
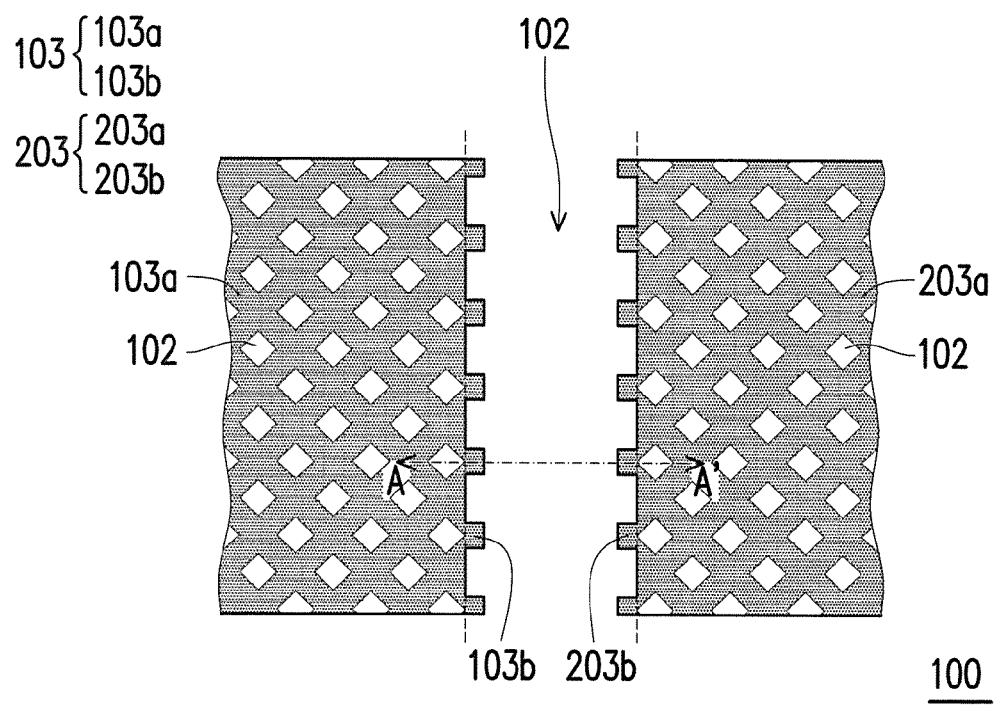
FIG. 2A to FIG. 2D are schematic enlarged views respectively illustrating a region in FIG. 1.
Figure 3:
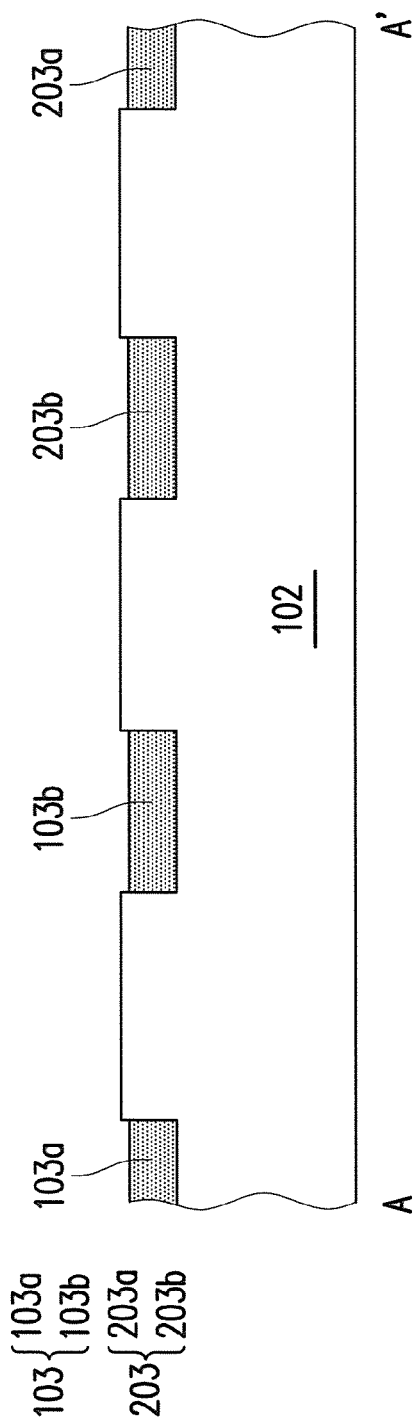
FIG. 3 is a schematic cross-sectional view taken along line A-A' of FIG. 2A according to some embodiments of the disclosure.

FIG. 2A is a schematic enlarged view illustrating a region 100 in FIG. 1. FIG. 3 is a schematic cross-sectional view taken along line A-A' of FIG. 2A according to some embodiments of the disclosure. Referring to FIG. 2A and FIG. 3 simultaneously, the carrier substrate 10 includes an insulation encapsulation 102, and the first conductive patterns 101, the second conductive patterns 201, the first dummy pattern 103, and the second dummy pattern 203 are embedded in the insulation encapsulation 102. The insulation encapsulation 102 exposes top surfaces of the first conductive patterns 101, the second conductive patterns 201, the first dummy pattern 103, and the second dummy pattern 203 such that these elements may be connected to other electrical components through the top surfaces thereof. Although the top surfaces of the first conductive patterns 101, the second conductive patterns 201, the first dummy pattern 103, and the second dummy pattern 203 illustrated in FIG. 3 are lower than a top surface of the insulation encapsulation 102, the disclosure is not limited thereto. In some alternative embodiments, the top surfaces of the first conductive patterns 101, the second conductive patterns 201, the first dummy pattern 103, and the second dummy pattern 203 may be coplanar with the top surface of the insulation encapsulation 102.

The insulation encapsulation 102 encapsulates the first conductive patterns 101, the second conductive patterns 201, the first dummy pattern 103, and the second dummy pattern 203 to electrically insulate the first conductive patterns 101 from the first dummy pattern 103 and to electrically insulate the second conductive patterns 201 from the second dummy pattern 203. A material of the insulation encapsulation 102 includes, but is not limited to, Ajinomoto build-up film (ABF) resin, polymer material, or epoxy resin. In some embodiments, the insulation encapsulation 102 may be made of benzocyclo-butene (BCB), liquid crystal polymer (LCP), polyimide, polyphenylene ether (PPE), FR4, FR5, aramide (or aramid), molding compound, glass fiber mixed with epoxy, or a combination thereof. In some embodiments, an encapsulation material layer (not illustrated) may be formed to cover the first conductive patterns 101, the second conductive patterns 201, the first dummy pattern 103, and the second dummy pattern 203 through techniques such as a molding process. Subsequently, a portion of the encapsulation material layer is removed to expose the top surfaces of the first conductive patterns 101, the second conductive patterns 201, the first dummy pattern 103, and the second dummy pattern 203 to render the insulation encapsulation 102. Portions of the encapsulation material layer may be removed through an etching process or a chemical mechanical polishing (CMP) process.

Referring to FIG. 2A, the first dummy pattern 103 includes a first body portion 103a and a plurality of first protrusion 103b laterally protruding toward the second dummy pattern 203. Similarly, the second dummy pattern 203 includes a second body portion 203a and a plurality of second protrusions 203b laterally protruding toward the first dummy pattern 103. In other words, the first dummy pattern 103 has a plurality of first protrusions 103b located on an edge thereof and the second dummy pattern 203 has a plurality of second protrusions 203b located on an edge thereof. Therefore, from a top view, as illustrated in FIG. 2A, an edge profile of the first dummy pattern 103 facing the second dummy pattern 203 is non-linear. Similarly, an edge profile of the second dummy pattern 203 facing the first dummy pattern 103 is also non-linear. In other words, a layout region has a periodically wavy or zigzag shaped boundary, and the first dummy pattern 103 and the second dummy pattern 203 are disposed conformally along the periodically wavy or zigzag shaped boundary. The shape of the boundaries is not limited to having uniformly shaped waves. The shape of the boundaries may be adjusted according to the area where higher pressure is received during the semiconductor packaging process. For example, certain regions (high pressure areas; not illustrated) of the carrier substrate 10 may be subjected to higher pressure during the subsequent semiconductor packaging process. In some embodiments, the first protrusions 103b and the second protrusions 203b may be specifically placed in the areas of the carrier substrate 10 where pressure is applied. The pressure areas are typically subjected to machine pressure of 8 MPa to 10 MPa or a bending pressure of 350 g/cm$^2$ to 400 g/cm$^2$. In some embodiments, the edge profile of the first dummy pattern 103 and the edge profile of the second dummy pattern 203 are in mirror symmetry. However, the disclosure is not limited thereto. The edge profiles of the first dummy pattern 103 and the second dummy pattern 203 may be asymmetric in some alternative embodiments. As illustrated in FIG. 2A, the first protrusions 103b and the second protrusions 203b may be rectangular column shape, so the edge profiles of the first dummy pattern 103 and the second dummy pattern 203 exhibit a rectangular zigzag shape. However, it construes no limitation in the disclosure. As will be described later in embodiments of FIG. 2B to FIG. 2D, the first protrusions 103b and the second protrusions 203b may take other forms as long as the edge profiles of the first dummy pattern 103 and the second protrusions 203b form a periodically zigzag or wavy contour. In some embodiments, only the edge of the first dummy pattern 103 facing the second dummy pattern 203 is non-linear. However, such configuration merely serve as an exemplary illustration and the disclosure is not limited thereto. In some alternative embodiments, the entire edge (all four sides) of the first dummy pattern 103 and the entire edge of the second dummy pattern 203 are non-linear.

Since the edge profiles of the first dummy pattern 103 and the second dummy pattern 203 are non-linear, a contact area among the first dummy pattern 103, the second dummy pattern 203, and the insulation encapsulation 102 may be increased. Therefore, an adhesion between these elements may be adequately enhanced. As such, the breakage between the conductive pattern (for examples, the first conductive patterns 101, the second conductive patterns 201, the first dummy pattern 103, and the second dummy pattern 203) and the insulation encapsulation 102 may be sufficiently eliminated, thereby improving the reliability of a semiconductor package and an electronic product using the carrier substrate 10.

Figure 2B:
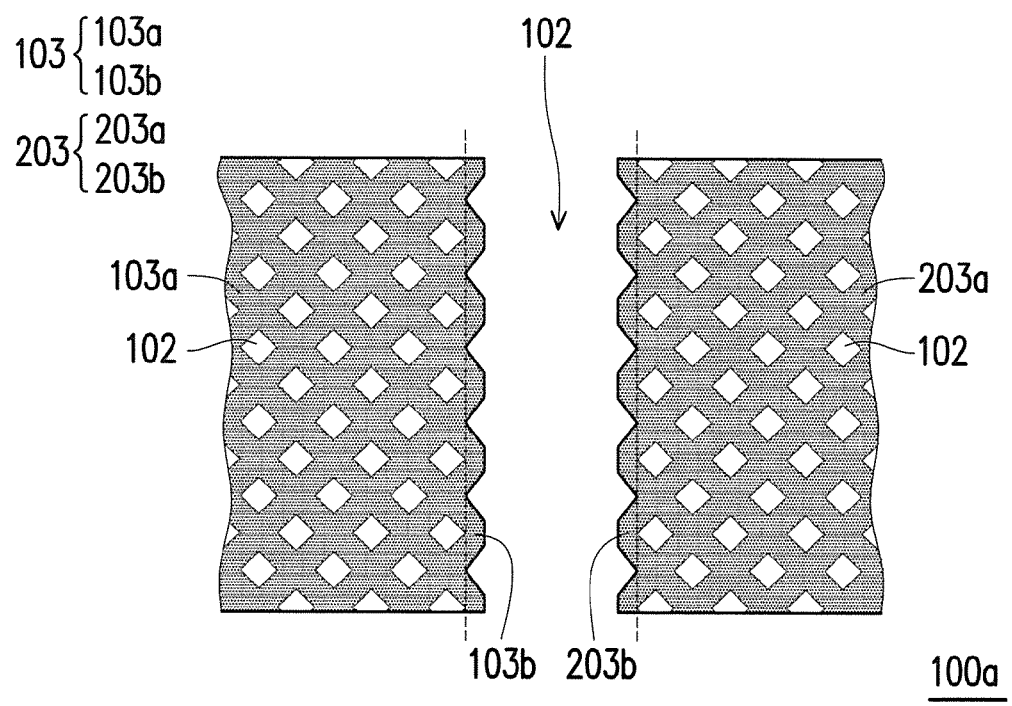

FIG. 2B is a schematic enlarged view illustrating a region 100a in FIG. 1. Referring to FIG. 2B, the embodiments illustrated in FIG. 2B is similar to the embodiment of FIG. 2A, so similar elements are denoted by the same reference numeral and the descriptions of these elements are not repeated herein. The difference between the embodiment of FIG. 2B and the embodiment of FIG. 2A is that in FIG. 2B, the first protrusions 103b and the second protrusions 203b are trapezoidal column shape to form V-shaped zigzag shape edge profiles. Similar to the embodiment of FIG. 2A, the non-linear edge profiles of FIG. 2B may increase contact area among the first dummy pattern 103, the second dummy pattern 203, and the insulation encapsulation 102. Therefore, the breakage between the conductive pattern (for examples, the first conductive patterns 101, the second conductive patterns 201, the first dummy pattern 103, and the second dummy pattern 203) and the insulation encapsulation 102 may be sufficiently eliminated, thereby improving the reliability of a semiconductor package and an electronic product using the carrier substrate 10.

Figure 2C:
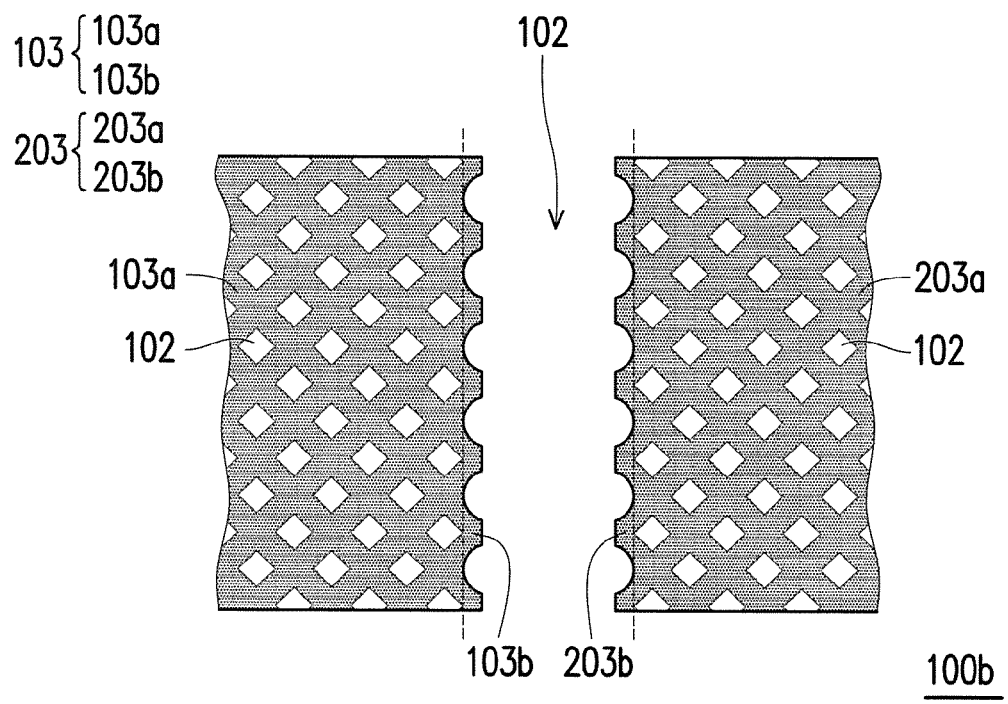

FIG. 2C is a schematic enlarged view illustrating a region 100b in FIG. 1. Referring to FIG. 2C, the embodiments illustrated in FIG. 2C is similar to the embodiment of FIG. 2A, so similar elements are denoted by the same reference numeral and the descriptions of these elements are not repeated herein. The difference between the embodiment of FIG. 2C and the embodiment of FIG. 2A is that in FIG. 2C, the first protrusions 103b and the second protrusions 203b are trapezoidal column shape with curvy legs to form semicircular zigzag shape edge profiles. Similar to the embodiment of FIG. 2A, the non-linear edge profiles of FIG. 2C may increase contact area among the first dummy pattern 103, the second dummy pattern 203, and the insulation encapsulation 102. Therefore, the breakage between the conductive pattern (for examples, the first conductive patterns 101, the second conductive patterns 201, the first dummy pattern 103, and the second dummy pattern 203) and the insulation encapsulation 102 may be sufficiently eliminated, thereby improving the reliability of a semiconductor package and an electronic product using the carrier substrate 10.

Figure 2D:
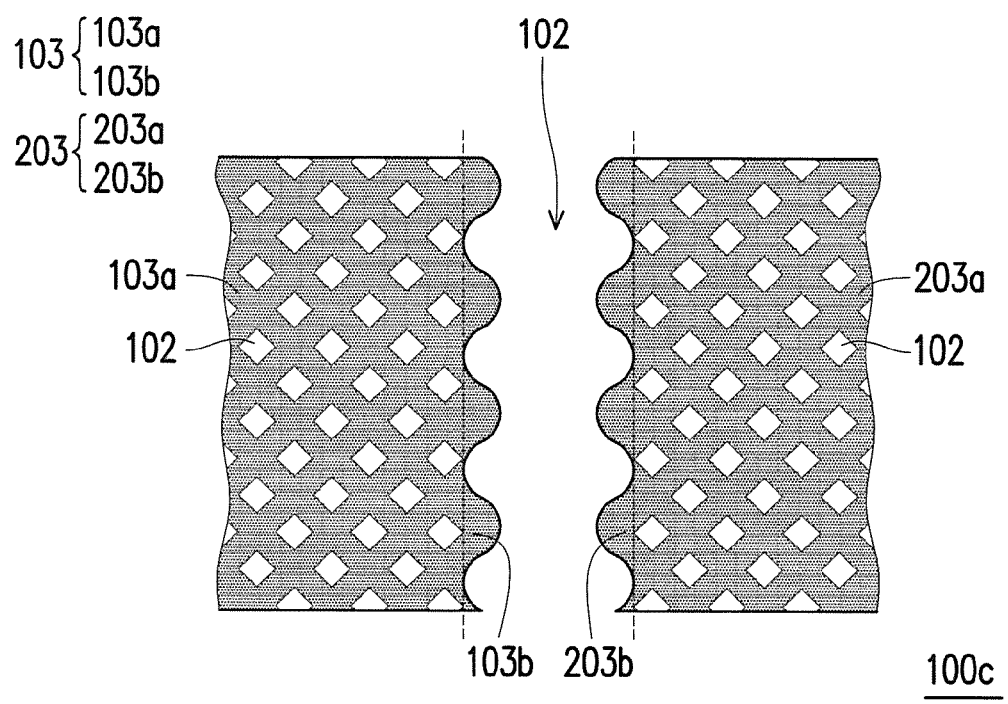

FIG. 2D is a schematic enlarged view illustrating a region 100c in FIG. 1. Referring to FIG. 2D, the embodiments illustrated in FIG. 2D is similar to the embodiment of FIG. 2A, so similar elements are denoted by the same reference numeral and the descriptions of these elements are not repeated herein. The difference between the embodiment of FIG. 2D and the embodiment of FIG. 2A is that in FIG. 2D, the first protrusions 103b and the second protrusions 203b are semicircular column shape to form wavy shape edge profiles. Similar to the embodiment of FIG. 2A, the non-linear edge profiles of FIG. 2D may increase contact area among the first dummy pattern 103, the second dummy pattern 203, and the insulation encapsulation 102. Therefore, the breakage between the conductive pattern (for examples, the first conductive patterns 101, the second conductive patterns 201, the first dummy pattern 103, and the second dummy pattern 203) and the insulation encapsulation 102 may be sufficiently eliminated, thereby improving the reliability of a semiconductor package and an electronic product using the carrier substrate 10.

Figure 4:
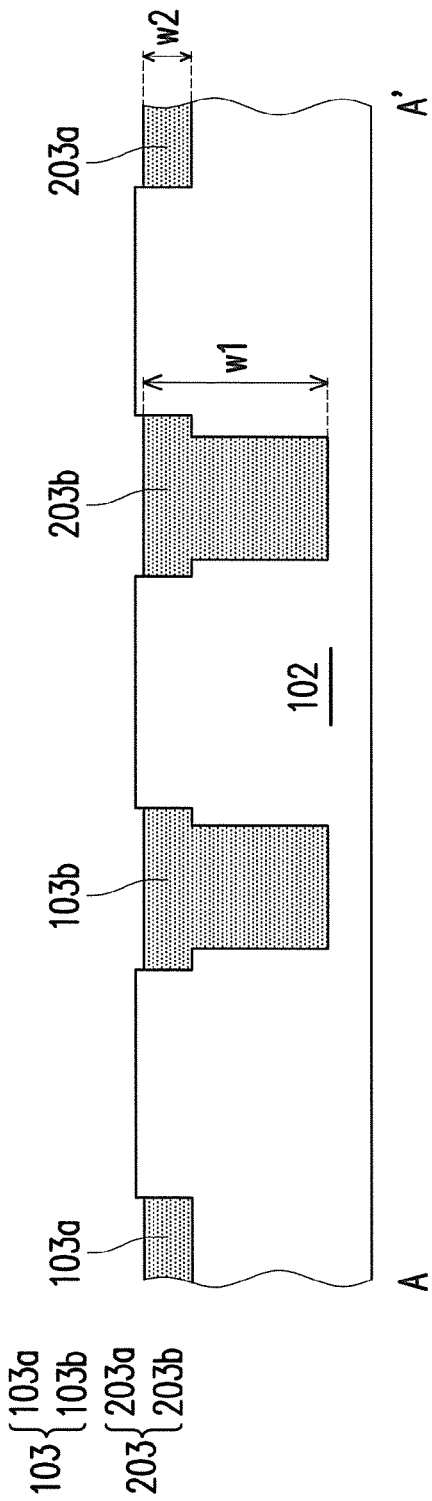
FIG. 4 is a schematic cross-sectional view taken along line A-A' of FIG. 2A according to some alternative embodiments of the disclosure.

FIG. 4 is a schematic cross-sectional view taken along line A-A' of FIG. 2A according to some alternative embodiments of the disclosure. Referring to FIG. 4, the embodiments illustrated in FIG. 4 is similar to the embodiment of FIG. 3, so similar elements are denoted by the same reference numeral and the descriptions of these elements are not repeated herein. The difference between the embodiment of FIG. 4 and the embodiment of FIG. 3 is that in FIG. 4, a thickness w1 of the first protrusions 103b and the second protrusions 203b is larger than a thickness w2 of the first body portion 103a and the second body portion 203a. In other words, the first protrusions 103b not only protrudes laterally, but also protrudes vertically. For example, the first body portion 103a and the second body portion 203a may be a conductive line layer. On the other hand, other than the conductive line layer, the first protrusions 103b and the second protrusions 203b may further include a conductive post located underneath the conductive line layer. As such, the thickness of the first dummy pattern 103 and the second dummy pattern 203 at the edges thereof is increased. Since the thickness w1 of the first protrusions 103b and the second protrusions 203b is larger than the thickness w2 of the first body portion 103a and the second body portion 203a, a contact area among the first dummy pattern 103, the second dummy pattern 203, and the insulation encapsulation 102 may be increased. Therefore, an adhesion between these elements may be adequately enhanced. As such, the breakage between the conductive pattern (for examples, the first conductive patterns 101, the second conductive patterns 201, the first dummy pattern 103, and the second dummy pattern 203) and the insulation encapsulation 102 may be sufficiently eliminated, thereby improving the reliability of a semiconductor package and an electronic product using the carrier substrate 10.

Figure 5:
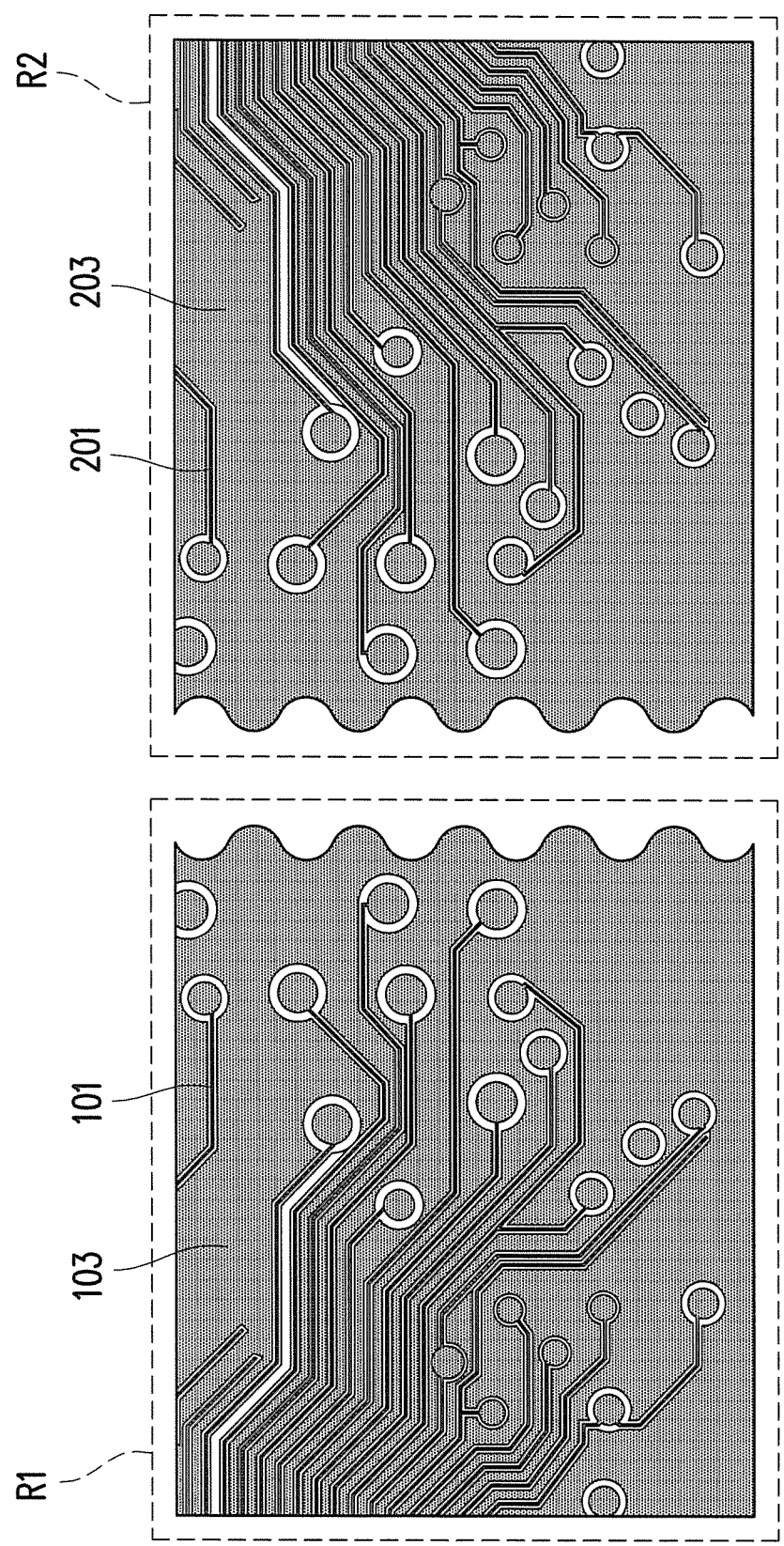
FIG. 5 is a schematic top view illustrating a carrier substrate according to some alternative embodiments of the disclosure.

FIG. 5 is a schematic top view illustrating a carrier substrate 10a according to some alternative embodiments of the disclosure. Referring to FIG. 5, the embodiments illustrated in FIG. 5 is similar to the embodiment of FIG. 1, so similar elements are denoted by the same reference numeral and the descriptions of these elements are not repeated herein. The difference between the embodiment of FIG. 5 and the embodiment of FIG. 1 is that in FIG. 5, at least a portion of the first dummy pattern 103 is located between two adjacent first conductive patterns 101 and at least a portion of the second dummy pattern 203 is located between two adjacent second conductive patterns 201. In other words, in the embodiment of FIG. 5, there is no peripheral region. The first dummy pattern 103 and the second dummy pattern 203 are disposed in the core region CR. Similar to the embodiment of FIG. 1, the edge profile of the first dummy pattern 103 facing the second dummy pattern 203 and the edge profile of the second dummy pattern 203 facing the first dummy pattern 103 are non-linear. Therefore, a contact area among the first dummy pattern 103, the second dummy pattern 203, and the insulation encapsulation 102 may be increased. As such, the breakage between the conductive pattern (for examples, the first conductive patterns 101, the second conductive patterns 201, the first dummy pattern 103, and the second dummy pattern 203) and the insulation encapsulation 102 may be sufficiently eliminated, thereby improving the reliability of a semiconductor package and an electronic product using the carrier substrate 10.

Base on the above, by altering the edge profile of the dummy patterns in a carrier substrate, the breakage among the dummy pattern, the conductive pattern, and the insulation encapsulation may be sufficiently eliminated, thereby improving the reliability of a semiconductor package and an electronic product using the carrier substrate. In addition, by increasing the thickness of certain portion of the dummy patterns, the contact area between the dummy patterns and the insulation encapsulation may be enlarged. The portions of the dummy patterns with increased thickness may also be strategically placed in areas where increased pressure is applied in comparison to other areas during manufacturing process of the semiconductor package. Therefore, the scenario where breakage occurs may be reduced and the reliability of the semiconductor package and the electronic products may be further ensured.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A carrier substrate having a first layout region and a second layout region, comprising: an insulation encapsulation; a plurality of first conductive patterns located in the first layout region and a plurality of second conductive patterns located in the second layout region, wherein the first conductive patterns and the second conductive patterns are embedded in the insulation encapsulation, and the insulation encapsulation exposes top surfaces of the first conductive patterns and the second conductive patterns; and at least one first dummy pattern located in the first layout region and at least one second dummy pattern located in the second layout region, wherein the first dummy pattern and the second dummy pattern are insulated from the first conductive patterns and the second conductive patterns, the first dummy pattern and the second dummy pattern are embedded in the insulation encapsulation, the insulation encapsulation exposes top surfaces of the first dummy pattern and the second dummy pattern, and an edge profile of the first dummy pattern facing the second dummy pattern is non-linear, wherein the first dummy pattern comprises a first body portion and a plurality of first protrusions protruding toward the second dummy pattern, and wherein the first protrusions are embedded in the insulation encapsulation.

2. The carrier substrate according to claim 1, wherein the edge profile of the first dummy pattern and an edge profile of the second dummy pattern are in mirror symmetry.

3. The carrier substrate according to claim 1, wherein the edge profile of the first dummy pattern facing the second dummy pattern comprises a rectangular zigzag shape, a V-shaped zigzag shape, a semicircular zigzag shape, a wavy shape, or a combination thereof.

4. The carrier substrate according to claim 1, wherein the first layout region and the second layout region respectively comprises a peripheral region and a core region, and the first dummy pattern and the second dummy pattern are located in the peripheral regions.

5. The carrier substrate according to claim 4, wherein the first dummy pattern and the second dummy pattern are mesh structures.

6. The carrier substrate according to claim 4, wherein the first dummy pattern surrounds the first conductive patterns and the second dummy pattern surrounds the second conductive patterns.

7. The carrier substrate according to claim 1, wherein at least a portion of the first dummy pattern is located between two adjacent first conductive patterns and at least a portion of the second dummy pattern is located between two adjacent second conductive patterns.

8. The carrier substrate according to claim 1, wherein the thickness of the first protrusions is larger than a thickness of the first body portion.

9. The carrier substrate according to claim 8, wherein the second dummy pattern comprises a second body portion and a plurality of second protrusions protruding toward the first dummy pattern, and a thickness of the second protrusions is larger than a thickness of the second body portion.

10. The carrier substrate according to claim 8, wherein the first protrusions comprises a rectangular column shape, a trapezoidal column shape, or a semicircular column shape.

11. The carrier substrate according to claim 8, wherein the first protrusions are located on an edge of the first dummy pattern.

12. The carrier substrate according to claim 8, wherein the first protrusions are located in an area of the carrier substrate receiving the pressure during semiconductor packaging process.

13. The carrier substrate according to claim 1, wherein the first dummy pattern and the second dummy pattern are connected to a ground, connected to a power source, or electrically floating.

14. The carrier substrate according to claim 1, wherein the first conductive patterns, the second conductive patterns, the first dummy pattern, and the second pattern comprise copper, aluminum, gold, silver, nickel, palladium, or a combination thereof.

15. The carrier substrate according to claim 1, wherein the insulation encapsulation comprises Ajinomoto build-up film (ABF) resin, polymer material, or epoxy resin.

16. The carrier substrate according to claim 1, wherein top surfaces of the first conductive patterns, the second conductive patterns, the first dummy pattern, and the second dummy pattern are lower than a top surface of the insulation encapsulation.

17. The carrier substrate according to claim 1, wherein top surfaces of the first conductive patterns, the second conductive patterns, the first dummy pattern, and the second dummy pattern are coplanar with a top surface of the insulation.

* * * * *